United States Patent
Sun et al.

(10) Patent No.: US 11,404,665 B2
(45) Date of Patent: Aug. 2, 2022

(54) ENCAPSULATION METHOD OF DISPLAY PANEL, DISPLAY PANEL, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Quanqin Sun, Beijing (CN); Song Zhang, Beijing (CN); Ang Xiao, Beijing (CN); Duanming Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 713 days.

(21) Appl. No.: 16/328,498

(22) PCT Filed: Aug. 17, 2018

(86) PCT No.: PCT/CN2018/101085
§ 371 (c)(1),
(2) Date: Feb. 26, 2019

(87) PCT Pub. No.: WO2019/109667
PCT Pub. Date: Jun. 13, 2019

(65) Prior Publication Data
US 2021/0359253 A1    Nov. 18, 2021

(30) Foreign Application Priority Data
Dec. 6, 2017  (CN) .......................... 201711279313.5

(51) Int. Cl.
*H01L 51/52* (2006.01)
*H01L 51/56* (2006.01)
*H01L 51/00* (2006.01)

(52) U.S. Cl.
CPC ...... *H01L 51/5253* (2013.01); *H01L 51/0002* (2013.01); *H01L 51/0019* (2013.01);
(Continued)

(58) Field of Classification Search
CPC ............. H01L 51/5253; H01L 51/0002; H01L 51/0019; H01L 51/56; H01L 2251/301; H01L 2251/5338
See application file for complete search history.

(56) References Cited

U.S. PATENT DOCUMENTS 4,747,909 A * 5/1988 Kanazawa .......... H01L 21/0271
257/E21.008
2015/0084008 A1   3/2015 Park et al.
(Continued)

FOREIGN PATENT DOCUMENTS

| CN | 104022233 A | 9/2014 |
| CN | 106684256 A | 5/2017 |

(Continued)

OTHER PUBLICATIONS

International Search Report and Written Opinion dated Nov. 23, 2018; PCT/CN2018/101085.
(Continued)

*Primary Examiner* — Kyoung Lee

(57) ABSTRACT

An encapsulation method of a display panel, a display panel and a display device are disclosed. The encapsulation method of the display panel includes: forming at least one thin film encapsulation inorganic material layer on a thin film encapsulation region of a display substrate; forming a photoresist pattern on the at least one thin film encapsulation
(Continued)

inorganic material layer; and etching the at least one thin film encapsulation inorganic material layer by using the photoresist pattern as a mask to form a thin film encapsulation inorganic layer including a first opening pattern.

20 Claims, 9 Drawing Sheets

(52) U.S. Cl.
CPC ........ *H01L 51/56* (2013.01); *H01L 2251/301* (2013.01); *H01L 2251/5338* (2013.01)

(56) References Cited

U.S. PATENT DOCUMENTS

| | | |
|---|---|---|
| 2016/0141550 A1 | 5/2016 | Fujino et al. |
| 2017/0271623 A1 | 9/2017 | Wang et al. |
| 2018/0123074 A1* | 5/2018 | Lee ................... H01L 51/5237 |
| 2018/0309088 A1 | 10/2018 | Gong et al. |
| 2019/0081277 A1 | 3/2019 | Wang et al. |

FOREIGN PATENT DOCUMENTS

| | | |
|---|---|---|
| CN | 106711184 A | 5/2017 |
| CN | 106848106 A | 6/2017 |
| CN | 107403883 A | 11/2017 |
| CN | 107910452 A | 4/2018 |
| JP | 2014-002880 A | 1/2014 |

OTHER PUBLICATIONS

First Chinese Office Action dated Dec. 25, 2018; Appln. No. 201711279313.5.

* cited by examiner

ENCAPSULATION METHOD OF DISPLAY PANEL, DISPLAY PANEL, AND DISPLAY DEVICE

The present application claims priority to Chinese patent application No. 201711279313.5, filed on Dec. 6, 2017, the entire disclosure of which is incorporated herein by reference as part of the present application.

TECHNICAL FIELD

At least one embodiment of the present disclosure relates to an encapsulation method of a display panel, a display panel and a display device.

BACKGROUND

Organic light-emitting diode display devices are very sensitive to water vapor and oxygen, water vapor and oxygen permeating into the interior of a device is a major factor affecting a life of the device, therefore, Thin Film Encapsulation (TFE) is very important for organic light-emitting diode components. Currently, a common TFE encapsulation structure is a film structure including an inorganic material layer, an organic material layer and an inorganic material layer, an electroluminescent material is encapsulated inside the device to achieve a purpose of water resisting and oxygen barrier, thereby providing protection for the electroluminescent material. In an encapsulation process, an inorganic layer is generally formed by a chemical vapor deposition process (CVD), and in a case where a coating process of an inorganic layer is performed, a display substrate is blocked by a CVD mask, so as to coat an active region.

SUMMARY

At least one embodiment of the present disclosure provides an encapsulation method of a display panel, a display panel and a display device.

At least one embodiment of the present disclosure provides an encapsulation method of a display panel, including: forming at least one thin film encapsulation inorganic material layer on a thin film encapsulation region of a display substrate; forming a photoresist pattern on the at least one thin film encapsulation inorganic material layer, and etching the at least one thin film encapsulation inorganic material layer by using the photoresist pattern as a mask to form a thin film encapsulation inorganic layer including a first opening pattern.

In some examples, the first opening pattern is located in at least one selected from the group consisting of an edge portion and a middle portion of the thin film encapsulation inorganic layer.

In some examples, dry etching is performed on the at least one thin film encapsulation inorganic material layer to form the first opening pattern.

In some examples, the thin film encapsulation inorganic layer has a thickness ranging from 0.05 μm to 1 μm.

In some examples, the at least one thin film encapsulation inorganic material layer is formed by using a chemical vapor deposition method, and a film-forming temperature of the at least one thin film encapsulation inorganic material layer ranges from 50° C. to 100° C.

In some examples, the display substrate is provided with a plurality of electroluminescent units arranged in an array, and the thin film encapsulation inorganic layer covers the plurality of electroluminescent units.

In some examples, the encapsulation method of the display panel further includes: forming at least one thin film encapsulation organic layer on the thin film encapsulation region of the display substrate, and forming a plurality of thin film encapsulation inorganic layers by using a one-step patterning process, in a direction perpendicular to the display substrate, the at least one thin film encapsulation organic layer and the plurality of thin film encapsulation inorganic layer are alternately disposed, in which, the at least one thin film encapsulation organic layer includes a second opening pattern, and an orthographic projection of the first opening pattern on the display substrate coincides with an orthographic projection of the second opening pattern on the display substrate.

In some examples, the at least one thin film encapsulation organic layer including the second opening pattern is directly formed by using an inkjet printing technology.

In some examples, the display substrate includes a bonding region, forming the at least one thin film encapsulation inorganic material layer includes: covering a shielding strip on the bonding region; and depositing the at least one thin film encapsulation inorganic material layer on the display substrate covered with the shielding strip.

In some examples, the display substrate includes a bonding region, forming the at least one thin film encapsulation inorganic material layer includes: disposing a shielding layer on the display substrate, in which the shielding layer has an opening structure, and the shielding layer covers the bonding region and the opening structure exposes the thin film encapsulation region; and depositing the at least one thin film encapsulation inorganic material layer on the display substrate on which the shielding layer is disposed.

At least one embodiment of the present disclosure provides a display panel formed according to the encapsulation method of the display panel provided by any one of the above embodiments.

In some example, the display panel is a flexible display panel.

In some example, the display panel is an organic light-emitting diode display panel.

At least one embodiment of the present disclosure provides a display device including the display panel provided by any one of the above embodiments.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "on," "under," and the like are only used to indicate relative position relationship.

Figure 1A:
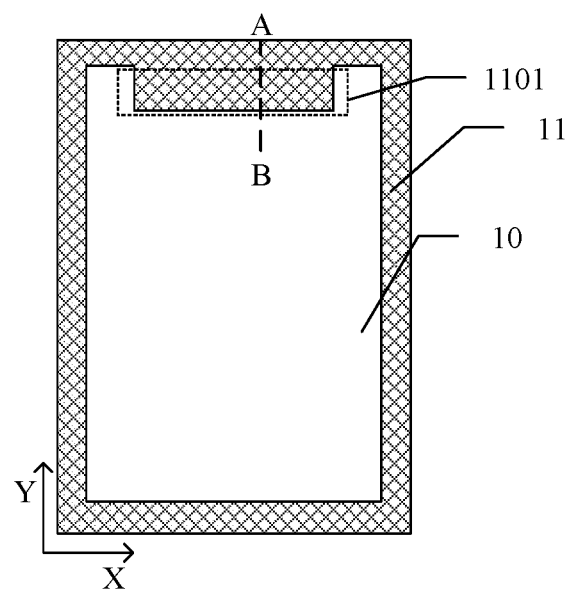
FIG. 1A is a schematic diagram of performing thin film encapsulation on a display panel by using a mask.
Figure 1B:
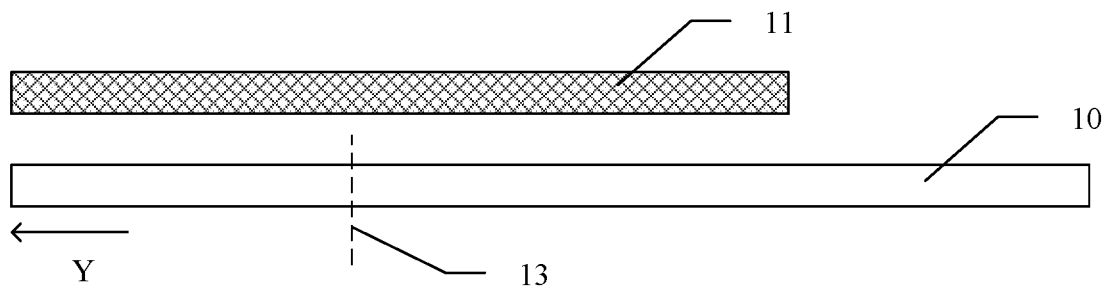
FIG. 1B is a schematic cross-sectional view of the display substrate covered with the mask shown in FIG. 1A taken along a line AB.

FIG. 1A is a schematic diagram of performing thin film encapsulation on a display panel by using a mask, and FIG. 1B is a schematic cross-sectional view of the display substrate covered with the mask shown in FIG. 1A taken along a line AB. As shown in FIG. 1A and FIG. 1B, a part region of a display substrate 10 is blocked by a mask 11 on the display substrate 10, and then a film is deposited on a thin film encapsulation region which is not blocked by the mask 11 by a Plasma Enhanced Chemical Vapor Deposition (PECVD) method. Herein, the mask 11 is a mask for patterning to form the thin film encapsulation region. For example, the thin film encapsulation region is a thin film encapsulation region having an opening at an edge portion of the thin film encapsulation region shown in FIG. 1A, that is, the mask 11 includes a protruding portion 1101 used to block a deposition material, thereby forming a thin film encapsulation inorganic layer having an opening pattern at an edge portion of the thin film encapsulation inorganic layer (i.e., the edge portion includes a gap).

Figure 1C:
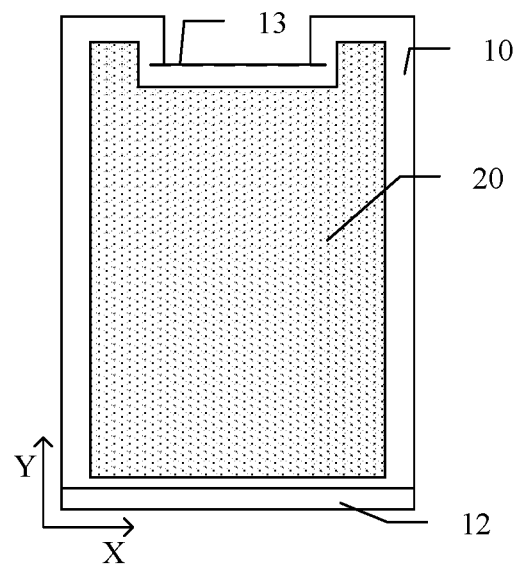
FIG. 1C is a schematic partial plane diagram of a display panel formed according to an encapsulation method shown in FIG. 1A.

FIG. 1C is a schematic partial plane diagram of a display panel formed according to an encapsulation method shown in FIG. 1A. A thin film encapsulation inorganic layer 20 shown in FIG. 1C is formed by using the mask 11 shown in FIG. 1A, an edge portion of the thin film encapsulation inorganic layer 20 extending along the X direction includes an opening pattern, for example, a side of the thin film encapsulation inorganic layer 20 extending along the X direction has a gap. After forming an encapsulation thin film, laser cutting (a laser cutting line 13 is shown in the figure) is performed on the display panel, that is, the laser cutting is performed on the display panel near a position of the opening pattern of the thin film encapsulation inorganic layer 20, so as to form a display panel having the same pattern as that of the thin film encapsulation inorganic layer 20. The display panel further includes a bonding region 12 in addition to the thin film encapsulation region.

Figure 1D:
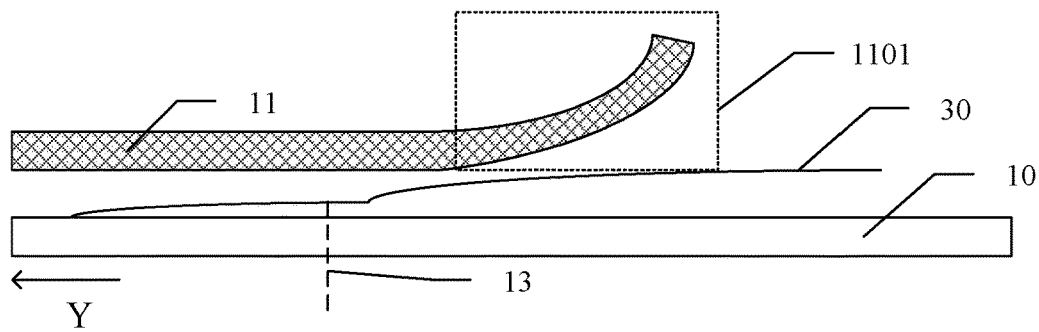
FIG. 1D is a schematic diagram showing warping of a protruding portion of a mask.

FIG. 1D is a schematic diagram showing warping of a protruding portion of a mask. As shown in FIG. 1D, in a research process, the inventor of the present application discovered that: in a coating process, upon the display substrate being continuously coated by a plasma enhanced chemical vapor deposition method, an edge portion of the protruding portion 1101 of the mask 11 for blocking the display substrate 10 may be warped upward, resulting in an region where the coating is deposited being not controlled. For example, a deposited thin film encapsulation inorganic layer (deposited along a deposition path 30 labeled in FIG. 1D) would extend beyond a line to be cut of the display panel, which may cause damage to the thin film encapsulation layer during a subsequent cutting process.

Embodiments of the present disclosure provide an encapsulation method of a display panel, a display panel and a display device. The encapsulation method of the display panel includes: forming at least one thin film encapsulation inorganic material layer on a thin film encapsulation region of a display substrate; forming a photoresist pattern on the at least one thin film encapsulation inorganic material layer, and etching the at least one thin film encapsulation inorganic material layer by using the photoresist pattern as a mask to form a thin film encapsulation inorganic layer including a first opening pattern. In the encapsulation method of the display panel, a mask used in a chemical vapor deposition (CVD) process is replaced by a photoresist mask, thereby avoiding problems such as inaccurate coating region caused by deformation of the CVD mask due to continuous use for a long period of time.

The encapsulation method of the display panel, the display panel and the display device provided by an embodiment of the present disclosure are described below with reference to the accompanying drawings.

Figure 2:
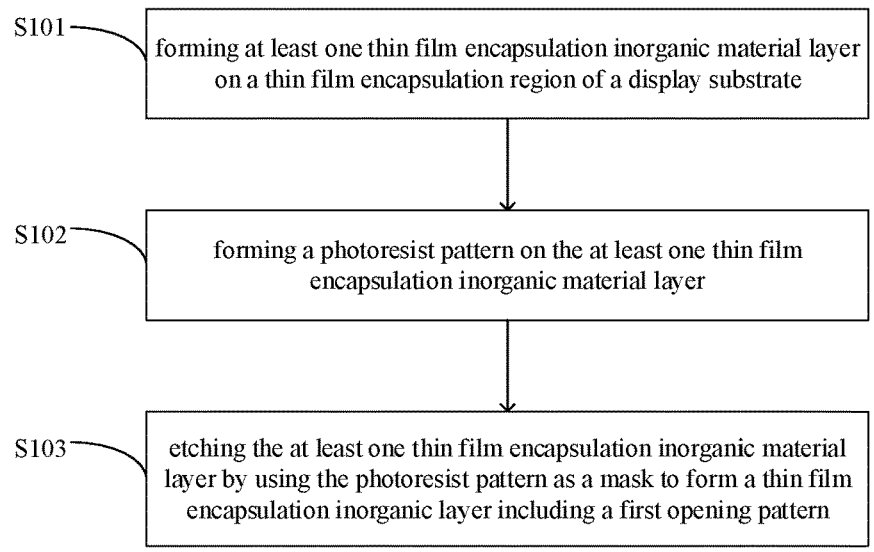
FIG. 2 is a schematic flowchart of an encapsulation method of a display panel according to an embodiment of the present disclosure.

An embodiment of the present disclosure provides an encapsulation method of a display panel, FIG. 2 is a schematic flowchart of an encapsulation method of a display panel according to the present embodiment, and FIG. 3A to FIG. 3E are schematic diagrams showing process steps of an encapsulation method of a display panel according to the present embodiment. As shown in FIG. 2 and FIGS. 3A-3E, specific steps are as follows:

S101: forming at least one thin film encapsulation inorganic material layer on a thin film encapsulation region of a display substrate.

Figure 3A:
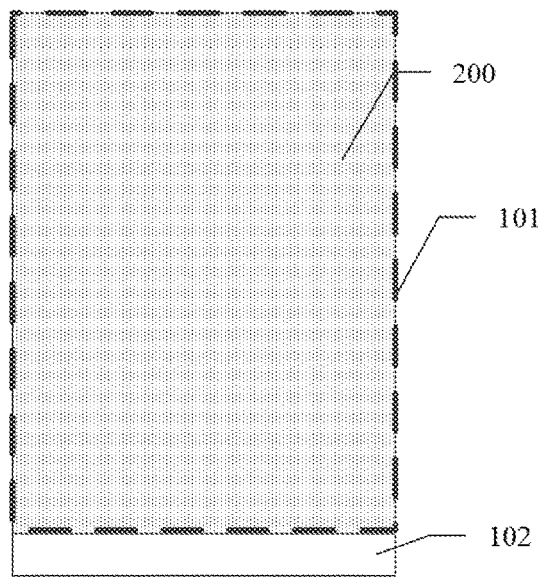
FIG. 3A to FIG. 3E are schematic diagrams showing process steps of an encapsulation method of a display panel according to an embodiment of the present disclosure.

For example, as shown in FIG. 3A, a thin film encapsulation inorganic material layer 200 is formed on a region other than a bonding region 102 of a display substrate by a plasma enhanced chemical vapor deposition method.

For example, a material of the thin film encapsulation inorganic material layer 200 may include a metal oxide or a metal nitride.

For example, the material of the thin film encapsulation inorganic material layer 200 may be silicon nitride or silicon oxynitride or the like.

For example, the display substrate includes a thin film encapsulation region 101 (a region circled by a dotted line) and a bonding region 102, the thin film encapsulation inorganic material layer 200 is formed in the thin film encapsulation region 101. FIG. 3A takes a case of forming one display panel as an example.

For example, in this embodiment, the at least one thin film encapsulation inorganic material layer 200 is formed on the display substrate by a chemical vapor deposition method, and a film-forming temperature of the thin film encapsulation inorganic material layer 200 ranges from 50° C. to 100° C.

For example, the film-forming temperature of the thin film encapsulation inorganic material layer 200 is in a range from 60° C. to 70° C.

For example, the film-forming temperature of the thin film encapsulation inorganic material layer 200 ranges from 80° C. to 90° C.

S102: forming a photoresist pattern on the at least one thin film encapsulation inorganic material layer.

Figure 3B:
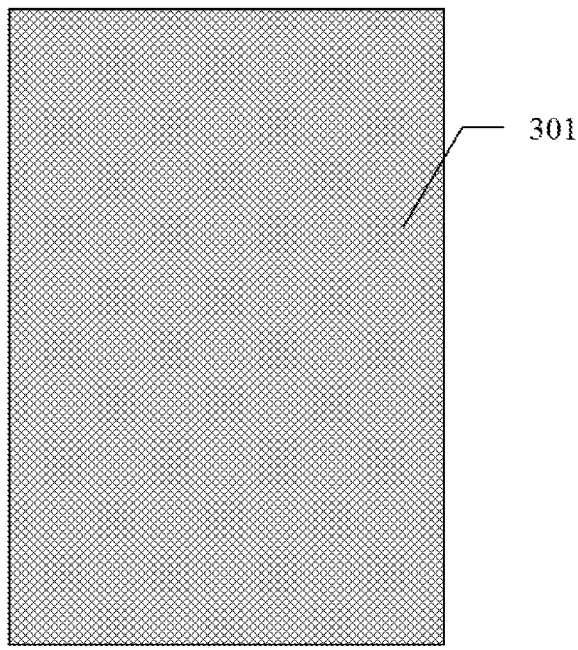

For example, as shown in FIG. 3B, a photoresist layer 301 is formed on the entire display substrate, that is, the photoresist layer 301 is coated on the thin film encapsulation inorganic material layer and the bonding region.

Figure 3C:
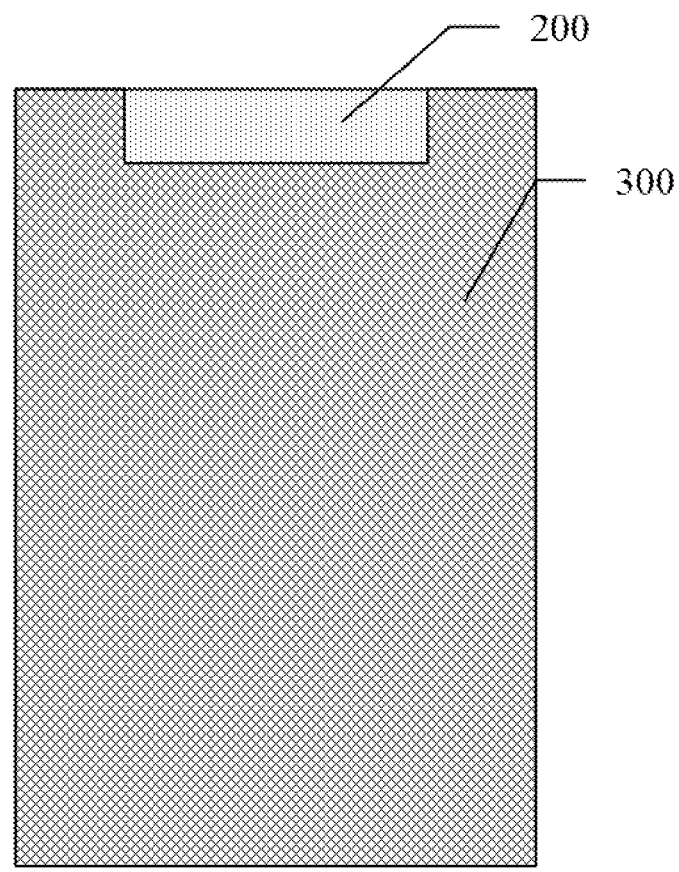

For example, as shown in FIG. 3C, the photoresist layer 301 is patterned to form a photoresist pattern 300.

For example, FIG. 3C takes a case that the photoresist pattern 300 is a photoresist pattern 300, an edge portion of which includes an opening pattern, as an example, and the opening pattern exposes the thin film encapsulation inorganic material layer 200 under the photoresist pattern 300.

S103: etching the at least one thin film encapsulation inorganic material layer by using the photoresist pattern as a mask to form a thin film encapsulation inorganic layer including a first opening pattern.

Figure 3D:
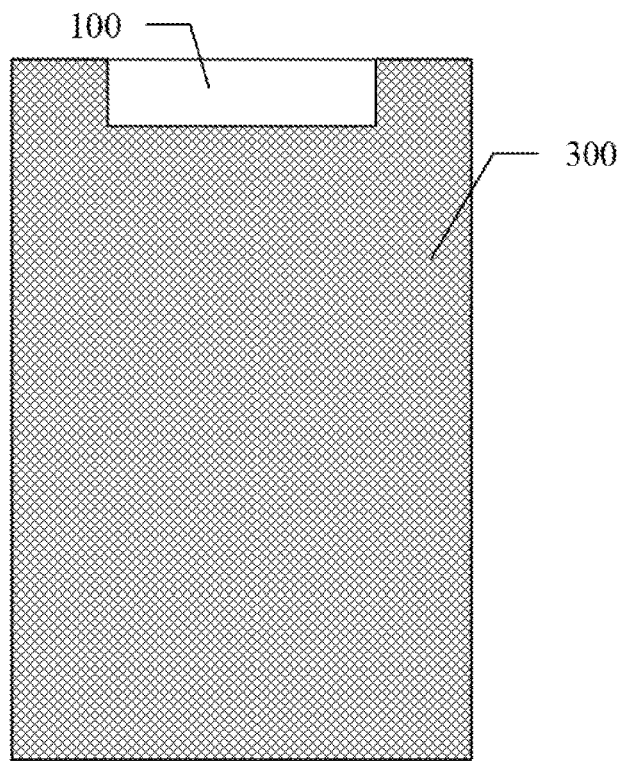
Figure 3E:
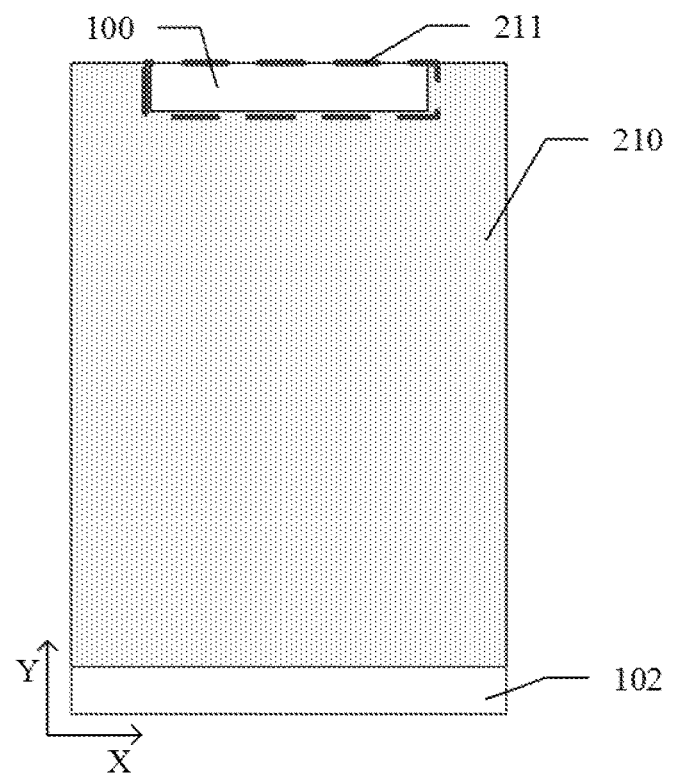

For example, as shown in FIG. 3D and FIG. 3E, the thin film encapsulation inorganic material layer 200 is dry etched by using the photoresist pattern 300 as a mask for the thin film encapsulation inorganic material layer 200, so as to form a thin film encapsulation inorganic layer 210 including a first opening pattern 211.

For example, this embodiment takes a case that the first opening pattern 211 is located at an edge portion of the thin film encapsulation inorganic layer 210 as an example. For example, as shown in FIG. 3E, an edge portion of the thin film encapsulation inorganic layer 210 extending in the X direction includes the first opening pattern 211. Here, the "the first opening pattern 211 is located at an edge portion of the thin film encapsulation inorganic layer 210" indicates that at least one side of the thin film encapsulation inorganic layer 210 has a gap.

Figure 4A:
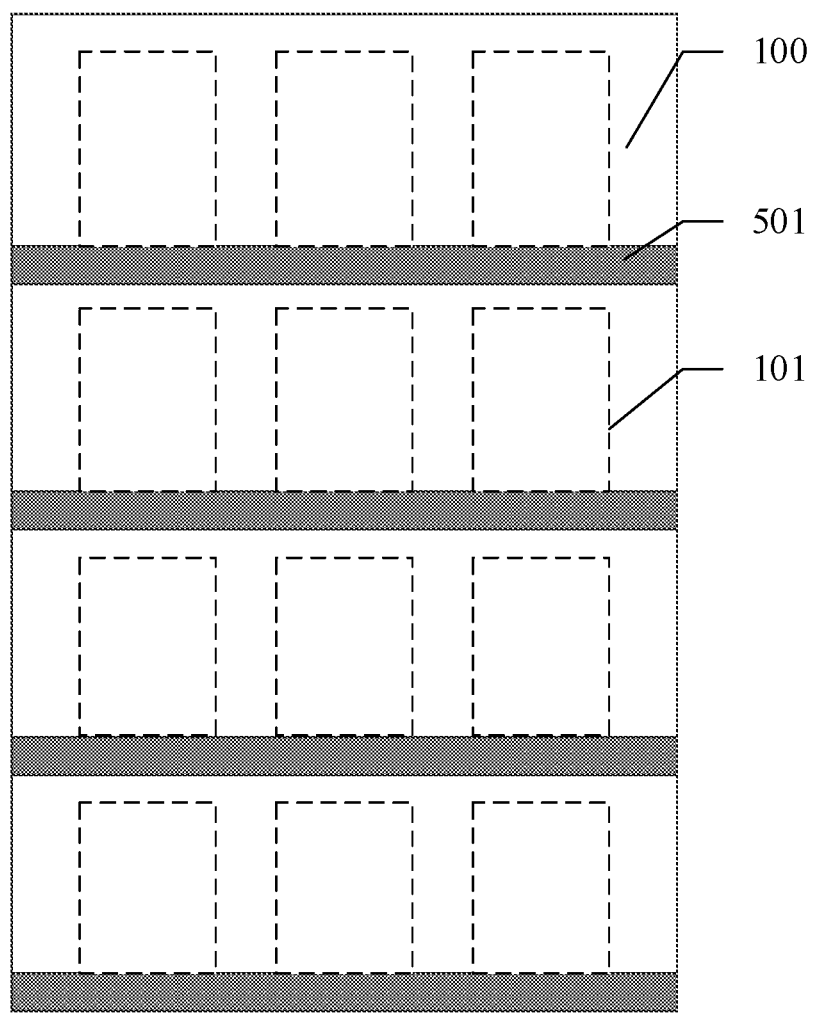
FIG. 4A is a schematic diagram of a CVD mask according to an example of an embodiment of the present disclosure.

FIG. 3E takes a case that a display panel formed is one display panel as an example, in general, in actual production, a plurality of display panels are integrally encapsulated, and then the plurality of display panels are separated by cutting. FIG. 4A is a schematic diagram of a CVD mask formed on a display substrate according to an example of the present embodiment, the display substrate shown in FIG. 4A is used to form a plurality of display panels. As shown in FIG. 4A, because the display substrate includes a bonding region (the bonding region 102 shown in FIG. 3E), forming the thin film encapsulation inorganic material layer includes: firstly covering a shielding strip 501 (i.e., a CVD mask) on the bonding region; and then depositing the thin film encapsulation inorganic material layer on the display substrate 100 covered with the shielding strip 501, in this case, the thin film encapsulation inorganic material layer deposited on the display substrate 100 is deposited on both the thin film encapsulation region 101 and a non-bonding region outside the thin film encapsulation region 101. After the thin film encapsulation inorganic material layer is formed, a thin film encapsulation inorganic layer having a first opening pattern may be formed according to the steps shown in FIG. 3B to FIG. 3E.

Figure 4B:
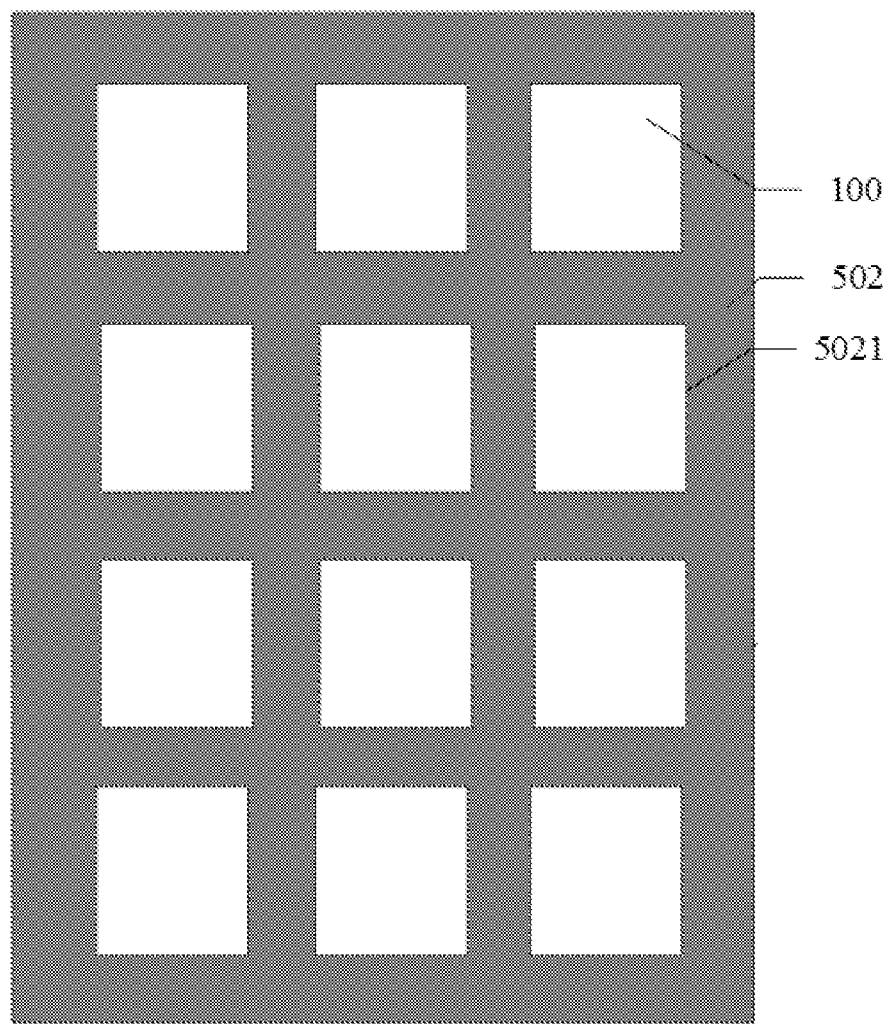
FIG. 4B is a schematic diagram of a CVD mask according to another example of an embodiment of the present disclosure.

FIG. 4B is a schematic diagram of a CVD mask formed on a display substrate according to another example of the present embodiment, the display substrate shown in FIG. 4B is used to form a plurality of display panels. As shown in FIG. 4B, because the display substrate 100 includes a bonding region (the bonding region 102 shown in FIG. 3E), forming the thin film encapsulation inorganic material layer includes: disposing a shielding layer 502 (i.e., a CVD mask) on the display substrate 100, in which the shielding layer 502 covers the bonding region and does not cover the thin film encapsulation region, that is, the shielding layer 502 includes an opening structure 5021, and the opening structure 5021 is configured to expose the thin film encapsulation region.

For example, the shielding layer 502 is a CVD mask including a plurality of opening structures 5021, a size of each opening structure 5021 is not less than a size of each thin film encapsulation region, so that the opening structure 5021 exposes the thin film encapsulation region used for the deposition of the thin film encapsulation inorganic material layer. The step of forming the thin film encapsulation inorganic material layer in this example further includes depositing a thin film encapsulation inorganic material layer on the display substrate 100 on which the shielding layer 502 is disposed. After the thin film encapsulation inorganic material layer is formed, a thin film encapsulation inorganic layer having a first opening pattern may be formed according to the steps shown in FIG. 3B to FIG. 3E.

Figure 5:
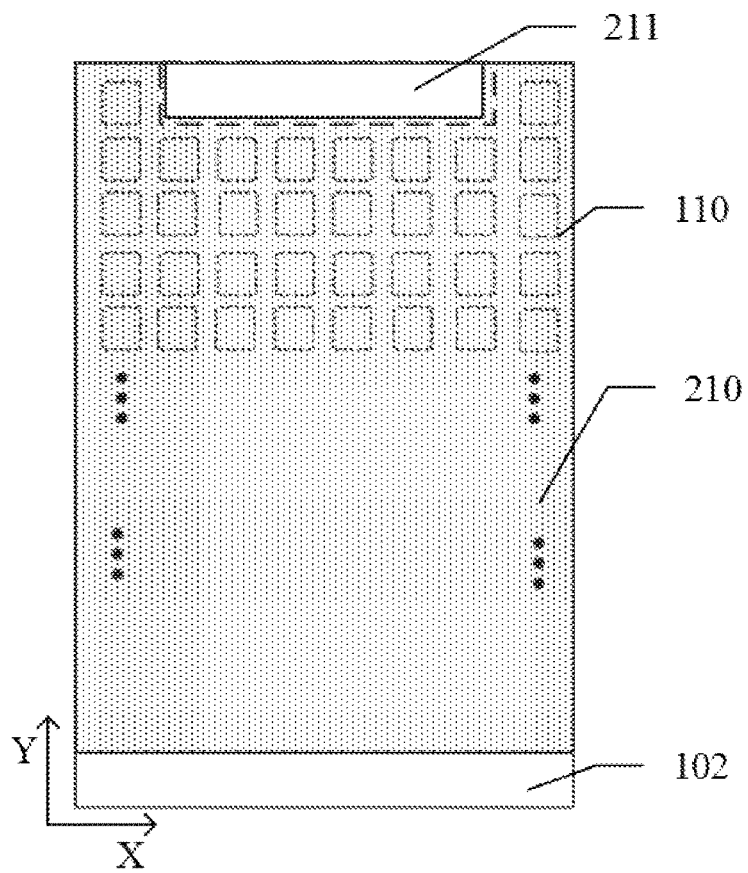
FIG. 5 is a schematic partial plane structural diagram of a display panel according to an embodiment of the present disclosure.

FIG. 5 is a schematic partial plane structural diagram of a display panel according to the present embodiment, as shown in FIG. 5, the display substrate provided by the present embodiment further includes a plurality of electroluminescent units 110 arranged in an array, that is, the plurality of electroluminescent units 110 arranged in the X direction and the Y direction, and the thin film encapsulation inorganic layer 210 covers the plurality of electroluminescent units 110.

For example, the plurality of electroluminescent units 110 are organic light-emitting diode units.

For example, in a direction perpendicular to the display substrate, the thin film encapsulation inorganic layer 210 has a thickness ranging from 0.6 µm to 1 µm. The present embodiment is not limited thereto, and the thickness of the thin film encapsulation inorganic layer may be made thinner. For example, the thickness of the thin film encapsulation inorganic layer may also range from 0.05 µm to 1 µm, or 0.05 µm to 0.3 µm, or the like. Thinning the thin film encapsulation inorganic layer, that is, thinning a thin film encapsulation layer for encapsulating the display substrate, can reduce a thickness of the display panel, so that the display panel can be lightening and thinning. Taking a case that the display substrate provided in this embodiment is an organic light-emitting diode display substrate as an example, the thin film encapsulation inorganic layer is used to encapsulate the display substrate to prevent water vapor and oxygen from eroding the organic light-emitting diode in the display substrate.

Figure 6A:
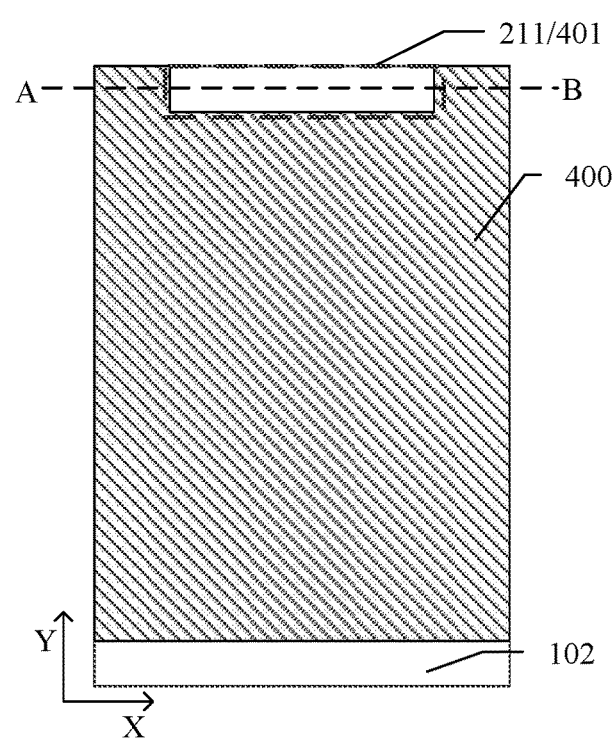
FIG. 6A is a schematic partial plane structural diagram of a display panel according to an embodiment of the present disclosure.
Figure 6B:
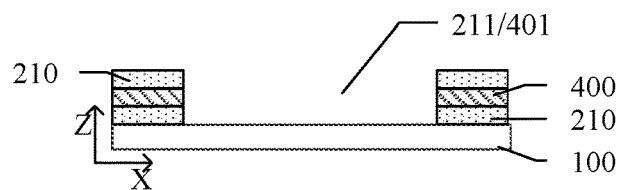
FIG. 6B is a schematic cross-sectional view of the display panel shown in FIG. 6A taken along a line AB.

For example, FIG. 6A is a schematic partial plane structural diagram of a display panel according to the present embodiment, and FIG. 6B is a schematic cross-sectional view of the display panel shown in FIG. 6A taken along a line AB. As shown in FIG. 6A and FIG. 6B, forming the display panel further includes: forming at least one thin film encapsulation organic layer 400 on the thin film encapsulation region of the display substrate, the thin film encapsulation organic layer 400 includes a second opening pattern 401, and an orthographic projection of the first opening pattern 211 on the display substrate coincides with an orthographic projection of the second opening pattern 401 on the display substrate. Here, coincidence includes complete coincidence and approximate coincidence.

For example, as shown in FIG. 6B, this embodiment takes a case that the thin film encapsulation layer formed by the provided encapsulation method includes two thin film encapsulation inorganic layers 210 and one thin film encapsulation organic layer 400 between the two thin film encapsulation inorganic layers 210 as an example, that is, in the direction perpendicular to the display substrate, the thin film encapsulation organic layer 400 and the thin film encapsulation inorganic layer 210 are alternately disposed. The display panel provided by the embodiment of the present disclosure is not limited to a case of including two thin film encapsulation inorganic layers, for example, the display panel may also include multiple, such as three, thin film encapsulation inorganic layers, and the like, and one thin film encapsulation organic layer is formed between adjacent two thin film encapsulation inorganic layers (here, the "thin film encapsulation inorganic layer" includes a single inorganic layer or a combined inorganic layer formed by combining a plurality of inorganic layers).

It should be noted that, FIG. 6A shows an example in which the thin film encapsulation organic layer 400 is formed on a side of a first thin film encapsulation inorganic layer away from the display substrate, in order to clearly show the thin film encapsulation organic layer 400, FIG. 6A does not show a second thin film encapsulation inorganic layer on a side of the thin film encapsulation organic layer 400 away from the display substrate.

For example, the present embodiment adopts an inkjet printing technology to directly form the thin film encapsulation organic layer 400 including a second opening pattern 410 on the thin film encapsulation inorganic layer 210, thereby saving the number of masks.

For example, taking a case of forming two thin film encapsulation inorganic layers 210 as shown in FIG. 6B as an example, the step of forming the thin film encapsulation inorganic layers further includes: forming two thin film encapsulation inorganic material layers on the thin film encapsulation region, forming two thin film encapsulation inorganic layers 210 by using a one-step patterning process on the two thin film encapsulation inorganic material layers, therefore, the mask process can be saved. That is, a first thin film encapsulation inorganic material layer may also be formed on the thin film encapsulation region, then a thin film encapsulation organic layer including the second opening pattern is formed on the first thin film encapsulation inorganic material layer, and then a second thin film encapsulation inorganic material layer is further formed on the thin film encapsulation organic layer, and finally the two thin film encapsulation inorganic layers are formed by performing a one-step patterning process on the two thin film encapsulation inorganic material layers.

The present embodiment is not limited thereto, the two thin film encapsulation inorganic material layers may also be separately patterned. That is, a first thin film encapsulation inorganic material layer is formed on the thin film encapsulation region and is patterned to form a first thin film encapsulation inorganic layer including a first opening pattern, then a thin film encapsulation organic layer including a second opening pattern is formed on the first thin film encapsulation inorganic layer, and then a second thin film encapsulation inorganic material layer is formed on the thin film encapsulation organic layer and is patterned to form a second thin film encapsulation inorganic layer including the first opening pattern.

Figure 7A:
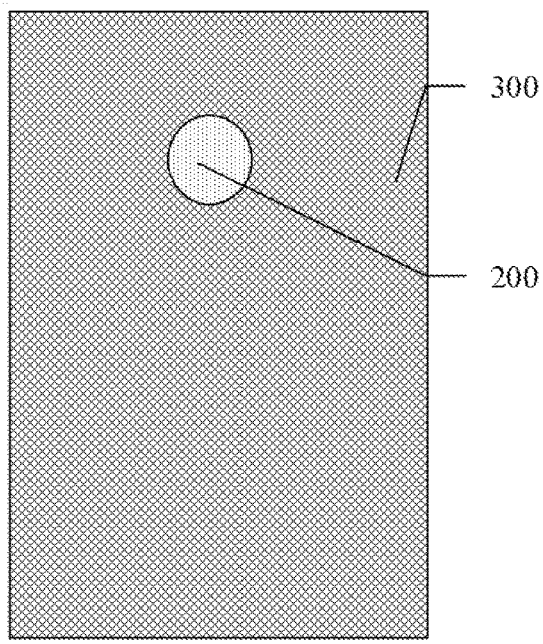
FIG. 7A and FIG. 7B are schematic flowcharts of a manufacturing process of a display panel according to another example of an embodiment of the present disclosure.
Figure 7B:
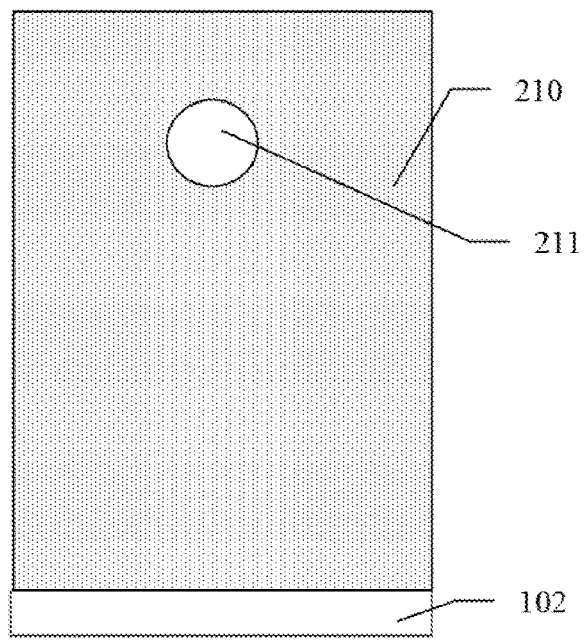

For example, FIG. 7A and FIG. 7B are schematic flowcharts of a manufacturing process of a display panel according to another example of the present embodiment. As shown in FIG. 7A and FIG. 7B, the difference from FIG. 3D and FIG. 3E is that: an opening pattern included in a photoresist pattern 300 in the present example is located at a middle portion of the photoresist pattern 300. The thin film encapsulation inorganic material layer 200 is etched by using the photoresist pattern 300 as a mask to form a thin film encapsulation inorganic layer 210 including a first opening pattern 211, and the first opening pattern 211 is located at the middle portion of the thin film encapsulation inorganic layer 210. Here, the "middle portion" is opposite to the "edge portion" shown in FIG. 3E, and the first opening pattern 211 being located at the middle portion of the thin film encapsulation inorganic layer 210 indicates that a shortest distance between the first opening pattern 211 and either side of the thin film encapsulation inorganic layer 210 is greater than zero.

The present example takes a case that a shape of the first opening pattern 211 is a circular shape as an example, but the present example is not limited thereto, the shape of the first opening pattern 211 may also be a rectangle or other shapes.

Figure 8:
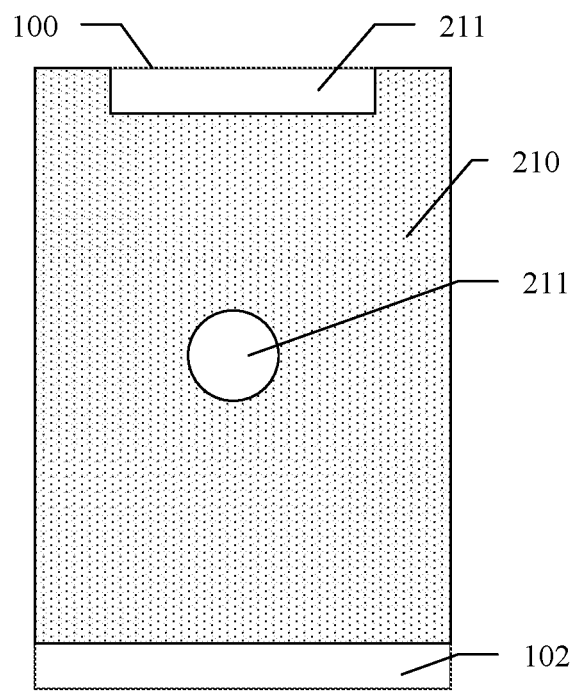
FIG. 8 is a schematic plane structural diagram of a display panel according to another example of an embodiment of the present disclosure.

For example, FIG. 8 is a schematic plane structural diagram of a display panel according to another example of the present embodiment. As shown in FIG. 8, the difference from FIG. 3E is that: a first opening pattern 211 in this example includes two portions located at an edge portion and a middle portion of the thin film encapsulation inorganic layer 210 respectively. The present example takes a case that a portion of the first opening pattern 211 located at the edge portion of the thin film encapsulation inorganic layer 210 is rectangular, and a portion of the first opening pattern 211 located in the middle portion of the thin film encapsulation inorganic layer 210 is circular as an example, however the present example does not limit the specific shape of the first opening pattern 211.

In the encapsulation method provided in the present embodiment, a photoresist mask is used to replace a chemical vapor deposition (CVD) mask, on the one hand, upon the first opening pattern being located at the edge portion of the thin film encapsulation inorganic layer, a problem, that a coating region is inaccurate caused by deformation of the CVD mask due to continuous use for a long period of time, can be avoided; on the other hand, upon the CVD mask being used a mask, the first opening pattern formed on the thin film encapsulation inorganic layer cannot be located at the middle portion of the thin film encapsulation inorganic layer, thus in the present example, the photoresist mask can overcome the defect that the first opening pattern cannot be formed at the middle portion of the thin film encapsulation inorganic layer by using the CVD mask.

Figure 9:
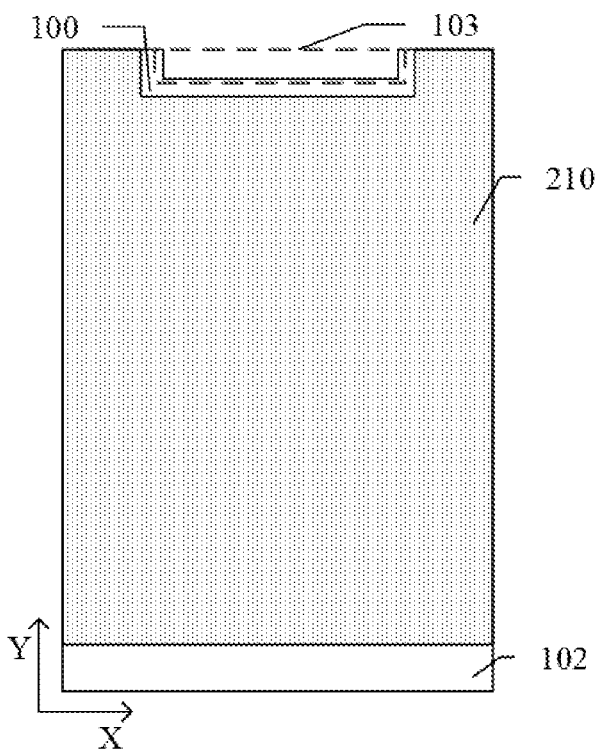
FIG. 9 is a schematic plane structural diagram of an encapsulated display panel.

FIG. 9 is a schematic plane structural diagram of an encapsulated display panel, as shown in FIG. 9, after an encapsulation step performed on the display panel is completed, the display panel can be cut, that is, laser cutting is performed on the display panel near a position of the first opening pattern of the thin film encapsulation inorganic layer 210, so as to form a display panel having the same pattern as that of the thin film encapsulation inorganic layer 210. FIG. 9 is an example in which a side of the display panel extending in the X direction includes an opening pattern 103 (i.e., a gap 103), however the present embodiment is not limited thereto, as long as the display panel has an irregular display region including a first opening pattern. For example, a shape of the display panel may also be a regular shape such as a regular rectangular or circular shape, while the display region of the display panel is a display region having an opening in the middle portion or the edge portion.

Another embodiment of the present disclosure provides a display panel, a plane structural diagram of the display panel is as shown in FIG. 9, and the display panel is a display panel formed by the encapsulation method provided by the above embodiments.

In some examples, an edge portion and/or a middle portion of the display panel includes an opening pattern. FIG. 9 shows an example that the edge portion of the display panel includes an opening pattern 103 (i.e., a gap 103), however the present disclosure is not limited thereto, as long as the display panel has a display region including a first opening pattern. For example, a shape of the display panel may also be a regular shape such as a normal rectangular or circular shape, while the display region of the display panel is a display region having an open in the middle portion or the edge portion.

In some examples, the display panel is a flexible display panel.

In some examples, the display panel is an organic light-emitting diode display panel.

Another embodiment of the present disclosure provides a display device, and the display device includes the display panel provided by the above embodiments.

For example, the display device may be an organic light-emitting diode (OLED) display device, and any products or components including the display device and having a display function such as a television, a digital camera, a mobile phone, a watch, a tablet, a notebook computer, a navigator or the like, and the embodiment is not limited thereto.

The following tips are to be noted:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, a layer or a structure may be enlarged. It should understood that, in the case in which a component or element such as a layer, film, area, substrate or the like is referred to be "on" or "under" another component or element, it may be "directly" on or under the another component or element or a component or element is interposed therebetween.

The foregoing is only the embodiments of the present invention and not intended to limit the scope of protection of the present invention, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. An encapsulation method of a display panel, comprising:
    forming at least one thin film encapsulation inorganic material layer on a thin film encapsulation region of a display substrate;
    forming a photoresist pattern on the at least one thin film encapsulation inorganic material layer; and
    etching the at least one thin film encapsulation inorganic material layer by using the photoresist pattern as a mask to form a thin film encapsulation inorganic layer including a first opening pattern;
    wherein the display panel comprises a display region and a non-display region, the non-display region comprises a bonding region, and the first opening pattern is only located in a region of the non-display region other than the bonding region.

2. The encapsulation method of the display panel according to claim 1, wherein the first opening pattern is located in at least one selected from the group consisting of an edge portion and a middle portion of the thin film encapsulation inorganic layer.

3. The encapsulation method of the display panel according to claim 1, wherein dry etching is performed on the at least one thin film encapsulation inorganic material layer to form the first opening pattern.

4. The encapsulation method of the display panel according to claim 1, wherein the at least one thin film encapsulation inorganic material layer is formed by using a chemical vapor deposition method, and a film-forming temperature of the at least one thin film encapsulation inorganic material layer ranges from 50° C. to 100° C.

5. The encapsulation method of the display panel according to claim 1, wherein the display substrate is provided with a plurality of electroluminescent units arranged in an array, and the thin film encapsulation inorganic layer covers the plurality of electroluminescent units.

6. The encapsulation method of the display panel according to claim 1, further comprising:
    forming at least one thin film encapsulation organic layer on the thin film encapsulation region of the display substrate, and forming a plurality of thin film encapsulation inorganic layers by using a one-step patterning process, in a direction perpendicular to the display substrate, the at least one thin film encapsulation organic layer and the plurality of thin film encapsulation inorganic layers are alternately disposed,
    wherein the at least one thin film encapsulation organic layer comprises a second opening pattern, and an orthographic projection of the first opening pattern on the display substrate coincides with an orthographic projection of the second opening pattern on the display substrate.

7. The encapsulation method of the display panel according to claim 6, wherein the at least one thin film encapsulation organic layer including the second opening pattern is directly formed by using an inkjet printing technology.

8. The encapsulation method of the display panel according to claim 1, wherein forming the at least one thin film encapsulation inorganic material layer comprises:
   covering a shielding strip on the bonding region; and
   depositing the at least one thin film encapsulation inorganic material layer on the display substrate covered with the shielding strip.

9. The encapsulation method of the display panel according to claim 1, wherein forming the at least one thin film encapsulation inorganic material layer comprises:
   disposing a shielding layer on the display substrate, wherein the shielding layer has an opening structure, and the shielding layer covers the bonding region and the opening structure exposes the thin film encapsulation region; and
   depositing the at least one thin film encapsulation inorganic material layer on the display substrate on which the shielding layer is disposed.

10. A display panel, formed by the encapsulation method of the display panel according to claim 1.

11. The display panel according to claim 10, wherein the display panel is a flexible display panel.

12. A display device, comprising the display panel according to claim 10.

13. The encapsulation method of the display panel according to claim 1, wherein the display region is an irregular display region.

14. An encapsulation method of a display panel, comprising:
   forming at least one thin film encapsulation inorganic material layer on a thin film encapsulation region of a display substrate;
   forming a photoresist pattern on the at least one thin film encapsulation inorganic material layer; and
   etching the at least one thin film encapsulation inorganic material layer by using the photoresist pattern as a mask to form a thin film encapsulation inorganic layer including a first opening pattern;
   the encapsulation method further comprising:
   forming at least one thin film encapsulation organic layer on the thin film encapsulation region of the display substrate, and forming a plurality of thin film encapsulation inorganic layers by using a one-step patterning process, in a direction perpendicular to the display substrate, the at least one thin film encapsulation organic layer and the plurality of thin film encapsulation inorganic layers are alternately disposed,
   wherein the at least one thin film encapsulation organic layer comprises a second opening pattern, and an orthographic projection of the first opening pattern on the display substrate coincides with an orthographic projection of the second opening pattern on the display substrate.

15. The encapsulation method of the display panel according to claim 14, wherein the at least one thin film encapsulation organic layer including the second opening pattern is directly formed by using an inkjet printing technology.

16. The encapsulation method of the display panel according to claim 14, wherein the display substrate comprises a bonding region, forming the at least one thin film encapsulation inorganic material layer comprises:
   covering a shielding strip on the bonding region; and
   depositing the at least one thin film encapsulation inorganic material layer on the display substrate covered with the shielding strip.

17. The encapsulation method of the display panel according to claim 14, wherein the display substrate comprises a bonding region, forming the at least one thin film encapsulation inorganic material layer comprises:
   disposing a shielding layer on the display substrate, wherein the shielding layer has an opening structure, and the shielding layer covers the bonding region and the opening structure exposes the thin film encapsulation region; and
   depositing the at least one thin film encapsulation inorganic material layer on the display substrate on which the shielding layer is disposed.

18. The encapsulation method of the display panel according to claim 14, wherein the first opening pattern is located in at least one selected from the group consisting of an edge portion and a middle portion of the thin film encapsulation inorganic layer.

19. The encapsulation method of the display panel according to claim 14, wherein dry etching is performed on the at least one thin film encapsulation inorganic material layer to form the first opening pattern.

20. An encapsulation method of a display panel, comprising:
   forming at least one thin film encapsulation inorganic material layer on a thin film encapsulation region of a display substrate;
   forming a photoresist pattern on the at least one thin film encapsulation inorganic material layer; and
   etching the at least one thin film encapsulation inorganic material layer by using the photoresist pattern as a mask to form a thin film encapsulation inorganic layer including a first opening pattern;
   wherein the at least one thin film encapsulation inorganic material layer is formed by using a chemical vapor deposition method, and a film-forming temperature of the at least one thin film encapsulation inorganic material layer ranges from 50° C. to 100° C.

* * * * *